(12) United States Patent
Choi et al.

(10) Patent No.: US 10,896,659 B2
(45) Date of Patent: Jan. 19, 2021

(54) MULTI-DISPLAY

(71) Applicant: LG Display Co., Ltd., Seoul (KR)

(72) Inventors: SoekMin Choi, Paju-si (KR); TaeWoo Kim, Paju-si (KR); Sunghyun Ahn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/726,483

(22) Filed: Dec. 24, 2019

(65) Prior Publication Data

US 2020/0211509 A1    Jul. 2, 2020

(30) Foreign Application Priority Data

Dec. 26, 2018    (KR) .................... 10-2018-0169416

(51) Int. Cl.
*G09G 5/14*        (2006.01)
*G09G 3/32*        (2016.01)
*H01L 27/32*       (2006.01)

(52) U.S. Cl.
CPC .............. *G09G 5/14* (2013.01); *G09G 3/32* (2013.01); *G09G 2356/00* (2013.01); *H01L 27/3293* (2013.01)

(58) Field of Classification Search
CPC .................................................. H01L 27/3293
See application file for complete search history.

(56) References Cited

FOREIGN PATENT DOCUMENTS

KR    10-1888464 B1    8/2018

OTHER PUBLICATIONS

Machine translation of KR101888464, published Aug. 16, 2018, application date Mar. 3, 2017 (Year: 2017).*

* cited by examiner

*Primary Examiner* — Gustavo Polo
(74) *Attorney, Agent, or Firm* — Morgan, Lewis & Bockius LLP

(57) ABSTRACT

Disclosed is a multi-display in which light emitting display apparatuses share information for varying a position of an image. The multi-display includes: at least two light emitting display apparatuses; and a distributing device distributing pieces of multi-image data transmitted from an external system to the light emitting display apparatuses, wherein a first controller controlling a function of a first light emitting display apparatus among the light emitting display apparatuses shares information for varying a position of an image with controllers controlling functions of the other light emitting display apparatuses. According to the multi-display of the present disclosure, even if the multi-image is shifted in various directions in order to prevent deterioration of the light emitting display apparatuses in the multi-display, a lossy image may be minimized or reduced.

7 Claims, 10 Drawing Sheets

MULTI-DISPLAY

CROSS-REFERENCE TO RELATED APPLICATIONS

This application claims the benefit and priority to the Korean Patent Application No. 10-2018-0169416 filed on Dec. 26, 2018, the entirety of which is incorporated herein by reference.

BACKGROUND

Technical Field

The present disclosure relates to a multi-display including light emitting display apparatuses.

Discussion of the Related Art

When a light emitting display apparatus using a light emitting device such as an organic light emitting diode (OLED) is continuously used, the light emitting devices configuring the light emitting display apparatus may be deteriorated to cause a residual image. In order to prevent this, various compensation methods for compensating for deterioration of the light emitting devices have been used.

Further, a method of compensating for deterioration of a light emitting device by varying a position at which an image is displayed in a light emitting display apparatus is also used.

A light emitting display apparatus is thin and light, and thus may be attached to a wall surface or the like so as to be used, and a multi-display including two or more light emitting display apparatuses is also used.

However, in a multi-display of a related art, the operation of varying a position at which an image is displayed is performed individually in each of the light emitting display apparatuses configuring the multi-display.

Therefore, when each of the light emitting display apparatuses in the multi-display changes a position at which an image is displayed, an image may be lost.

SUMMARY

Accordingly, embodiments of the present disclosure are directed to a multi-display that substantially obviates one or more problems due to limitations and disadvantages of the related art.

An aspect of the present disclosure is to provide a multi-display in which light emitting display apparatuses may share information for varying a position of an image.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a multi-display comprises at least two light emitting display apparatuses and a distributing device distributing pieces of multi-image data transmitted from an external system to the light emitting display apparatuses. A first controller controlling a function of a first light emitting display apparatus among the light emitting display apparatuses shares information for varying a position of an image with controllers controlling functions of the other light emitting display apparatuses.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Figure 1:
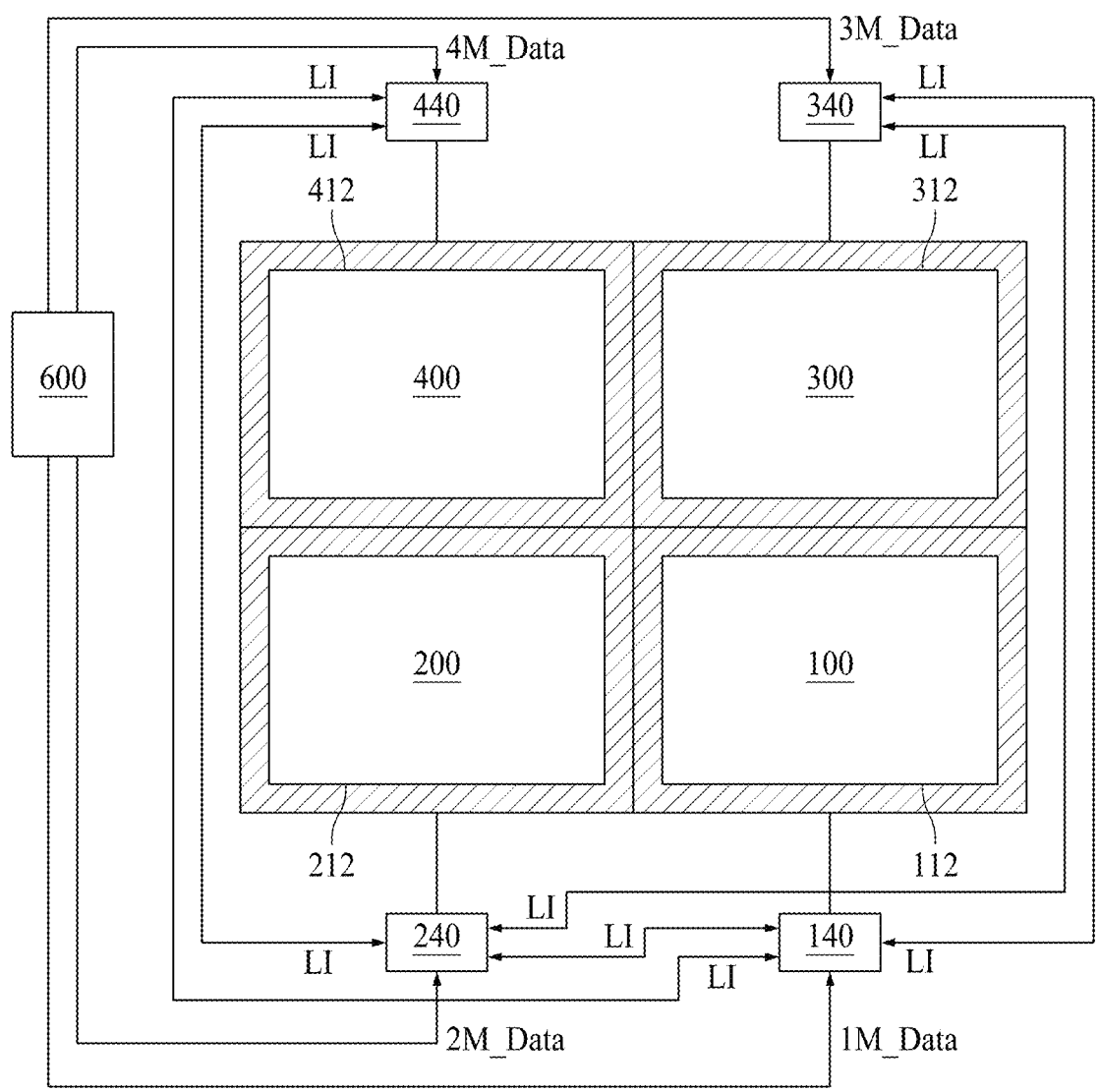
FIG. 1 is a view illustrating a configuration of a multi-display according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

In adding reference numerals to elements of each of the drawings, although the same elements are illustrated in other drawings, like reference numerals may refer to like elements.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
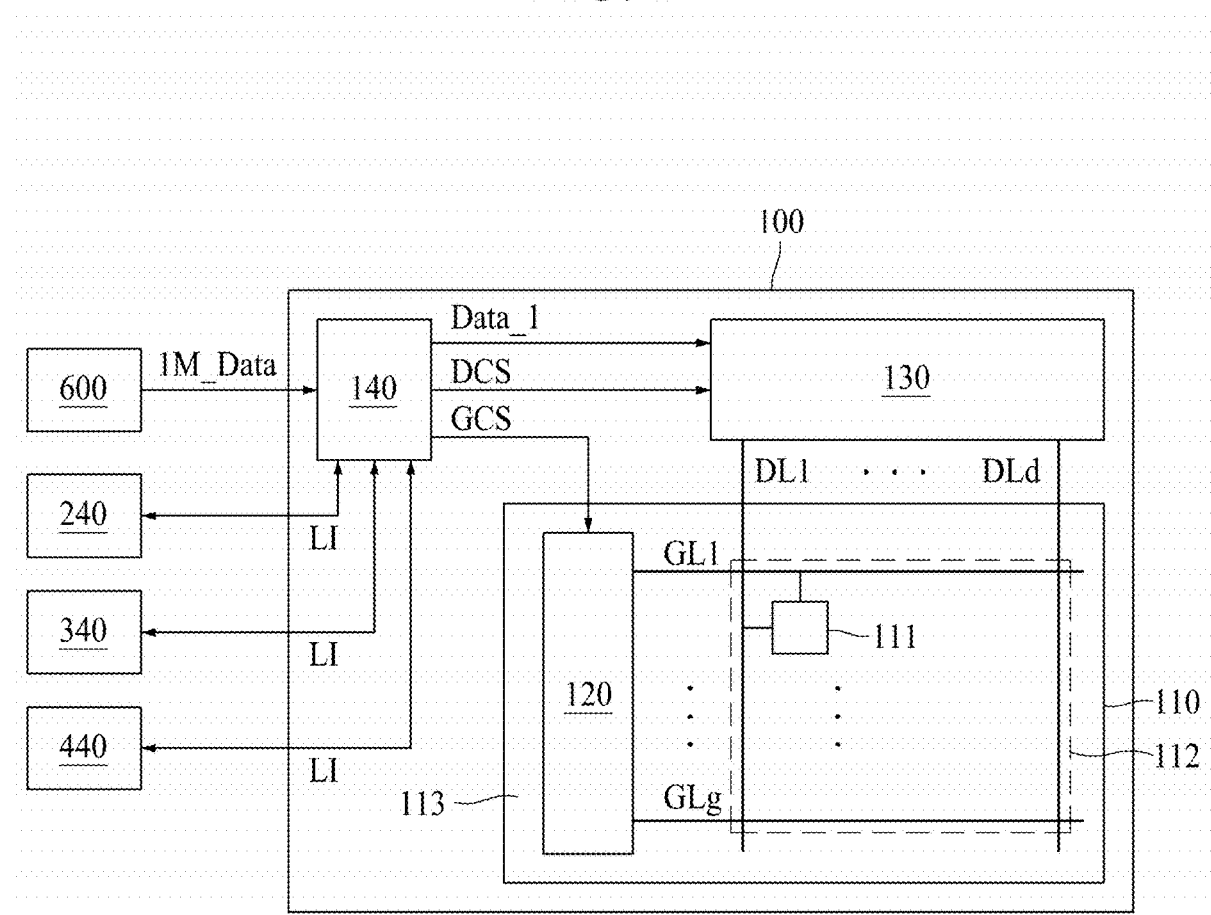
FIG. 2 is a view illustrating a configuration of a first light emitting display apparatus applied to a multi-display according to the present disclosure.
Figure 3:
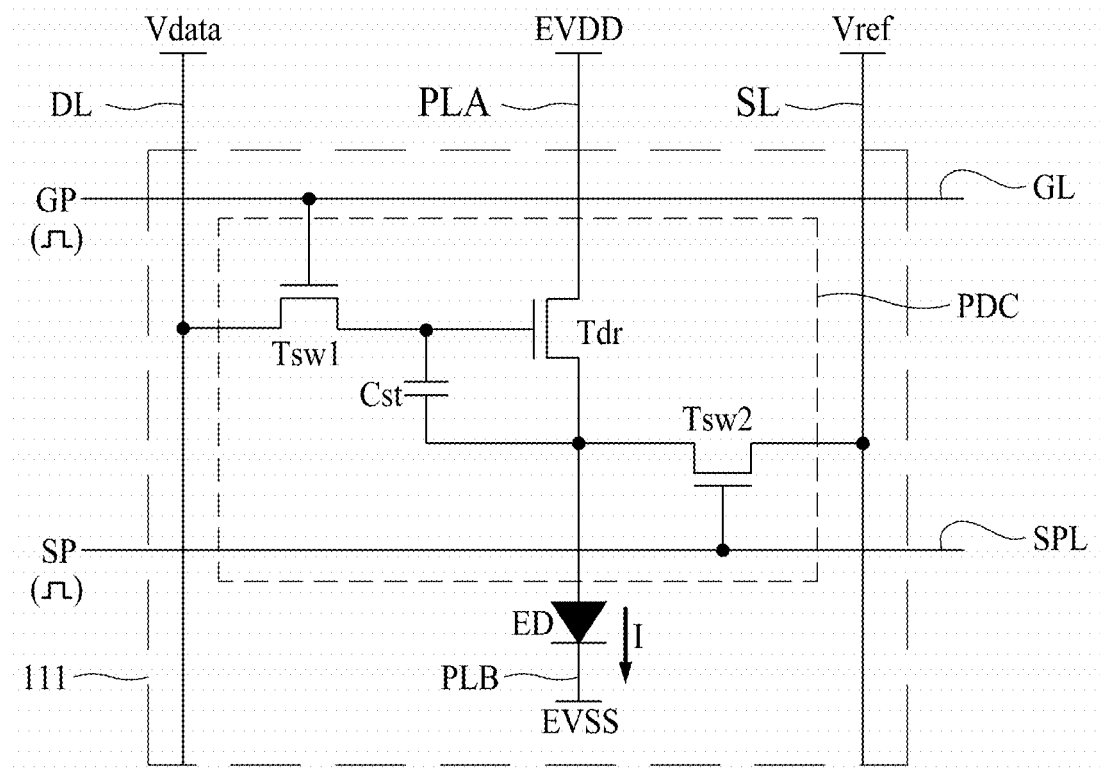
FIG. 3 is a view illustrating a configuration of a pixel applied to a first light emitting display apparatus shown in FIG. 2.
Figure 4:
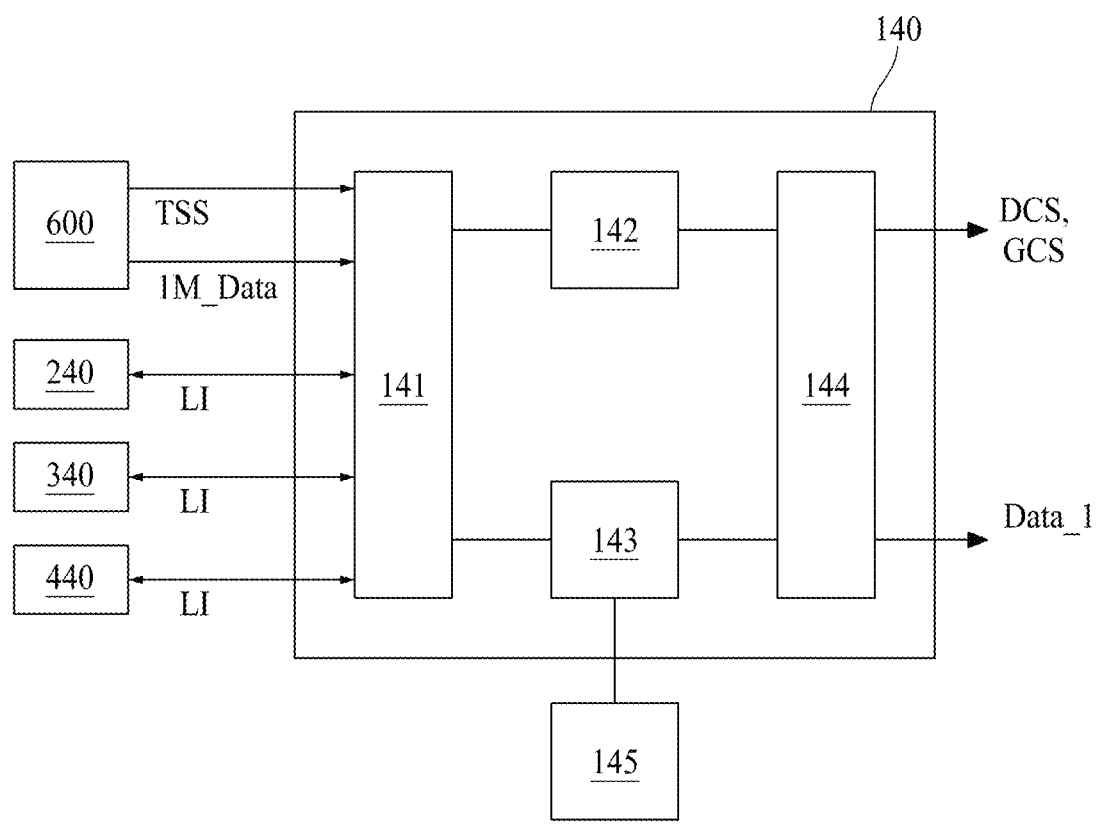
FIG. 4 is a view illustrating a configuration of a first controller applied to the first light emitting display apparatus shown in FIG. 2.

FIG. 1 is a view illustrating a configuration of a multi-display according to the present disclosure, FIG. 2 is a view illustrating a configuration of a first light emitting display apparatus applied to a multi-display according to the present disclosure, FIG. 3 is a view illustrating a configuration of a pixel applied to a first light emitting display apparatus shown in FIG. 2, and FIG. 4 is a view illustrating a configuration of a first controller applied to the first light emitting display apparatus shown in FIG. 2.

As shown in FIG. 1, a multi-display according to the present disclosure includes at least two light emitting display apparatuses 100, 200, 300, and 400 and a distributing device 600 distributing pieces of multi-image data transmitted from an external system to the light emitting display apparatuses 100, 200, 300, and 400. The multi-display shown in FIG. 1 includes four light emitting display apparatuses. Hereinafter, for convenience of explanation, the multi-display including four light emitting display apparatuses 100, 200, 300 and 400 as shown in FIG. 1 will be described as an example of the present disclosure.

A first controller 140 controlling a function of the first light emitting display apparatus 100 among the light emitting display apparatuses 100, 200, 300, and 400 shares information LI for varying a position of an image with controllers 240, 340, and 440 controlling functions of the other light emitting display apparatuses 200, 300, and 400.

The distributing device 600 receives pieces of image data corresponding to an image to be displayed on the light emitting display apparatuses (hereinafter simply referred to as a multi-image) from the external system and distributes the multi-image data to the four light emitting display apparatuses.

That is, among the pieces of multi-image data, the distributing device 600 transmits pieces of first multi-image data 1M_Data to be output on the first light emitting display apparatus 100 to the first controller 140, transmits pieces of second multi-image data 2M_Data to be output on the second light emitting display apparatus 200 to the second controller 240, transmits pieces of third multi-image data 3M_Data to be output on the third light emitting display device 300 to the third controller 340, and transmits pieces of fourth multi-image data 4M_Data to be output on the fourth light emitting display apparatus 400 to the fourth controller 440.

The configuration and functions of the four light emitting display apparatuses 100, 200, 300, and 400 are all the same. Therefore, the configuration and function of the first light emitting display apparatus 100 will be described below.

As shown in FIG. 2, the first light emitting display apparatus 100 includes a first light emitting display panel 110 outputting a first image corresponding to the pieces of first multi-image data, a first gate driver 120 supplying gate signals to the gate lines GL1 to GLg provided in the first light emitting display panel 110, a first data driver 130 supplying data voltages to data lines DL1 to DLd provided in the first light emitting display panel 110, and a first controller 140 controlling functions of the gate driver and the data driver.

First, the first light emitting display panel 110 is divided into a first display area 112 and a first non-display area 113. The first display area 112 includes pixels 111, and each of the pixels 111 includes at least one light emitting device.

As shown in FIGS. 2 and 3, the first light emitting display panel 110 includes pixels 111 each including the light emitting device ED and a pixel driving circuit PDC. In addition, the first light emitting display panel 110 includes signal lines that define a pixel area where the pixels 111 are formed and supply driving signals to the pixel driving circuit PDC.

The light emitting device ED includes a first electrode, a light emitting layer provided on the first electrode, and a second electrode provided on the light emitting layer. The light emitting layer may include any one of a blue light emitting portion, a green light emitting portion, and a red light emitting portion for emitting light of a color corresponding to a color set in the pixel 111. The light emitting layer may include any one of an organic light emitting layer, an inorganic light emitting layer and a quantum dot light emitting layer or may include a stacked or mixed structure of the organic light emitting layer (or the inorganic light emitting layer) and the quantum dot light emitting layer.

The signal lines may include a gate line GL, a sensing pulse line SPL, a data line DL, a reference voltage line SL, a first driving power supply line PLA, and a second driving power supply line PLB.

The gate lines GL are formed to be parallel at a predetermined interval in a second direction, e.g., a widthwise direction, of the first light emitting display panel 110.

The sensing pulse lines SPL may be formed at regular intervals so as to be parallel to the gate lines GL. A sensing pulse SP is supplied to the sensing pulse lines SPL.

The data lines DL may be formed to be parallel at regular intervals in a first direction, e.g., a lengthwise direction, of the first light emitting display panel 110 so as to intersect the gate lines GL and the sensing pulse lines SPL. However, an arrangement structure of the data line DL and the gate line GL may be variously modified.

The reference voltage line SL may be formed at regular intervals so as to be parallel to the data lines DL.

The first driving power supply line PLA may be formed at a regular interval so as to be parallel to the data line DL and the reference voltage line SL. The first driving power supply line PLA is connected to a power supply unit and supplies a first driving power EVDD supplied from the power supply unit to each pixel 111.

The second driving power supply lines PLBs supply a second driving power EVSS supplied from the power supply unit to each pixel 111.

The pixel driving circuit PDC includes a driving transistor Tdr controlling a magnitude of a current flowing through the light emitting device ED, a switching transistor Tsw1 connected between the data line DL and the driving transistor Tdr and the gate line GL, a sensing transistor Tsw2 transmitting the reference voltage Vref to a source of the driving transistor Tdr, and a capacitor Cst. In addition, the pixel driving circuit PDC included in each of the pixels 111 may further include transistors for compensating for deterioration of the driving transistor Tdr.

That is, the pixel driving circuit PDC may be modified to various structures other than the structure shown in FIG. 2, and the driving method of the pixel driving circuit PDC may also be variously modified.

Second, the first gate driver 120 supplies a gate-on signal GP to the gate lines GL1 to GLg provided in the first light emitting display panel 110 using gate control signals GCS transmitted from the first controller 140.

Here, the gate-on signal GP refers to a signal capable of turning on the switching transistor Tsw1 connected to the gate lines GL1 to GLg. A signal capable of turning off the switching transistor Tsw1 is called a gate-off signal. The gate-on signal GP and the gate-off signal are collectively referred to as a gate signal.

The first gate driver 120 may be formed separately from the first light emitting display panel 110 and may be connected to the first light emitting display panel 110 via a tape carrier package TCP, a chip on film (COF), a flexible printed circuit board (FPCB), and the like.

However, the first gate driver 120 may directly be formed outside the organic light emitting display panel 110 through a manufacturing process of the pixel driving circuits PDCs using a gate in panel (GIP) method.

Third, the first data driver 130 converts first image data Data transmitted from the first controller 140 into first data voltages Vdata and supplies the first data voltages to the data lines DL1 to DLd.

Fourth, the first controller 140 controls the first gate driver 120 and the first data driver 130.

As illustrated in FIG. 4, the first controller 140 generates a gate control signal GCS for controlling driving of the first gate driver 120 and a data control signal DCS for controlling driving of the first data driver 130 using the timing synchronization signal TSS input from the distributing device 600.

Further, the first controller 140 converts the pieces of the first multi-image data 1M_Data input from the distributing device 600 into pieces of first image data Data_1 and transmits the pieces of the first image data Data_1 to the first data driver 130.

In order to perform the function described above, the first controller 140 includes a data realigning unit 143 realigning the pieces of the first multi-image data 1M_Data transmitted from the distributing device 600 using the timing synchronization signal TSS transmitted from the distributing device 600 and supplying the realigned pieces of the first image data Data_1 to the first data driver 130, a control signal generating unit 142 generating the gate control signal GCS and the data control signal DCS using the timing synchronization signal TSS, an output unit 144 outputting the pieces of the first image data Data_1 generated by the data realigning unit 143 and the control signals DCS and GCS generated by the control signal generating unit 142 to the first data driver 130 or the first gate driver 120, and a communication unit 141 sharing the information LI for varying a position of the image by performing communication with the second controller 240, the third controller 340 and the fourth controller 440, and receiving the timing signal TSS and the pieces of the first multi-image data 1M_Data from the distributing device 600 as illustrated in FIG. 4.

The first controller 140 may further include a storage unit 145 storing pieces of first lossy image data to be transmitted to at least one of the second to fourth controllers 240, 340, and 440.

However, the storage unit 145 may be provided in the first light emitting display apparatus 100 independently of the first controller 140.

Figure 5:
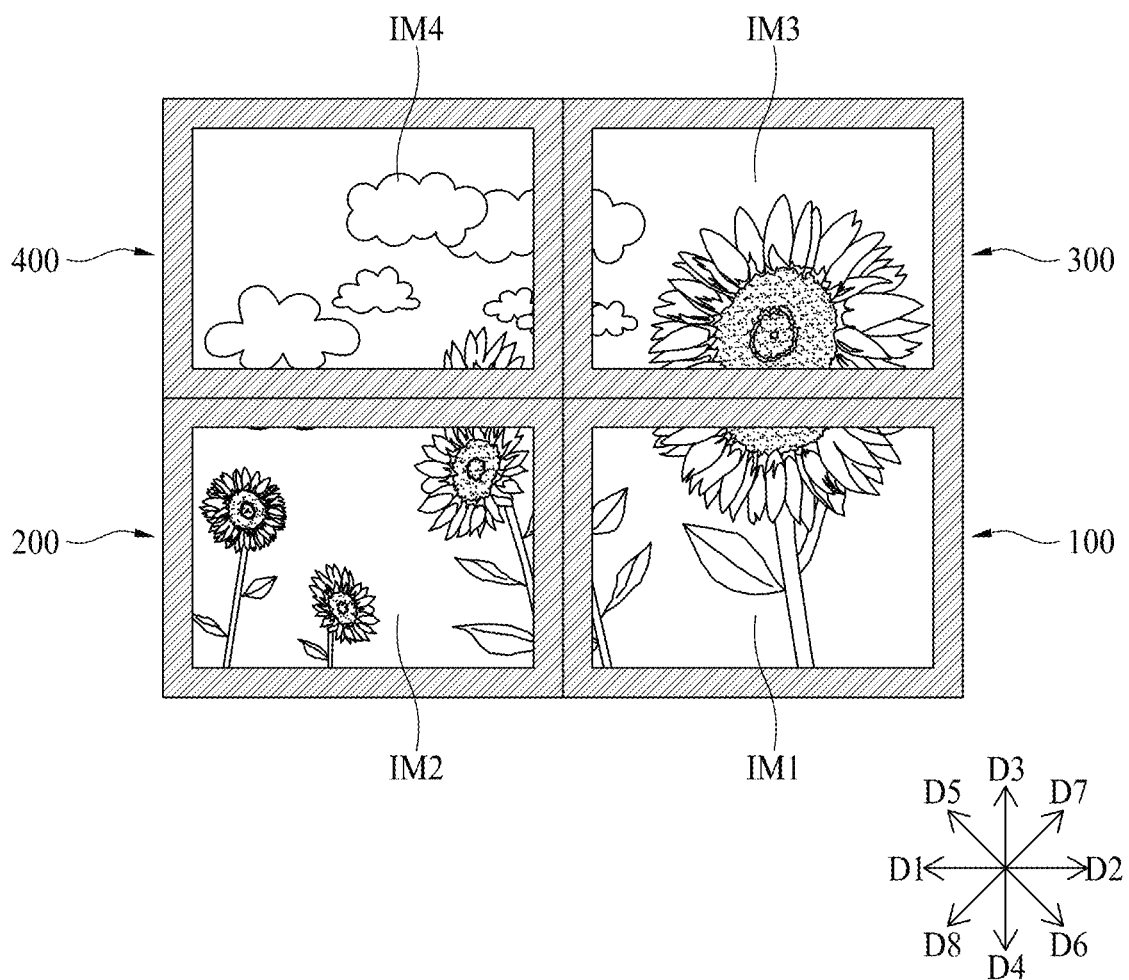
FIG. 5 is a view illustrating a multi-image output through a multi-display according to the present disclosure.
Figure 6:
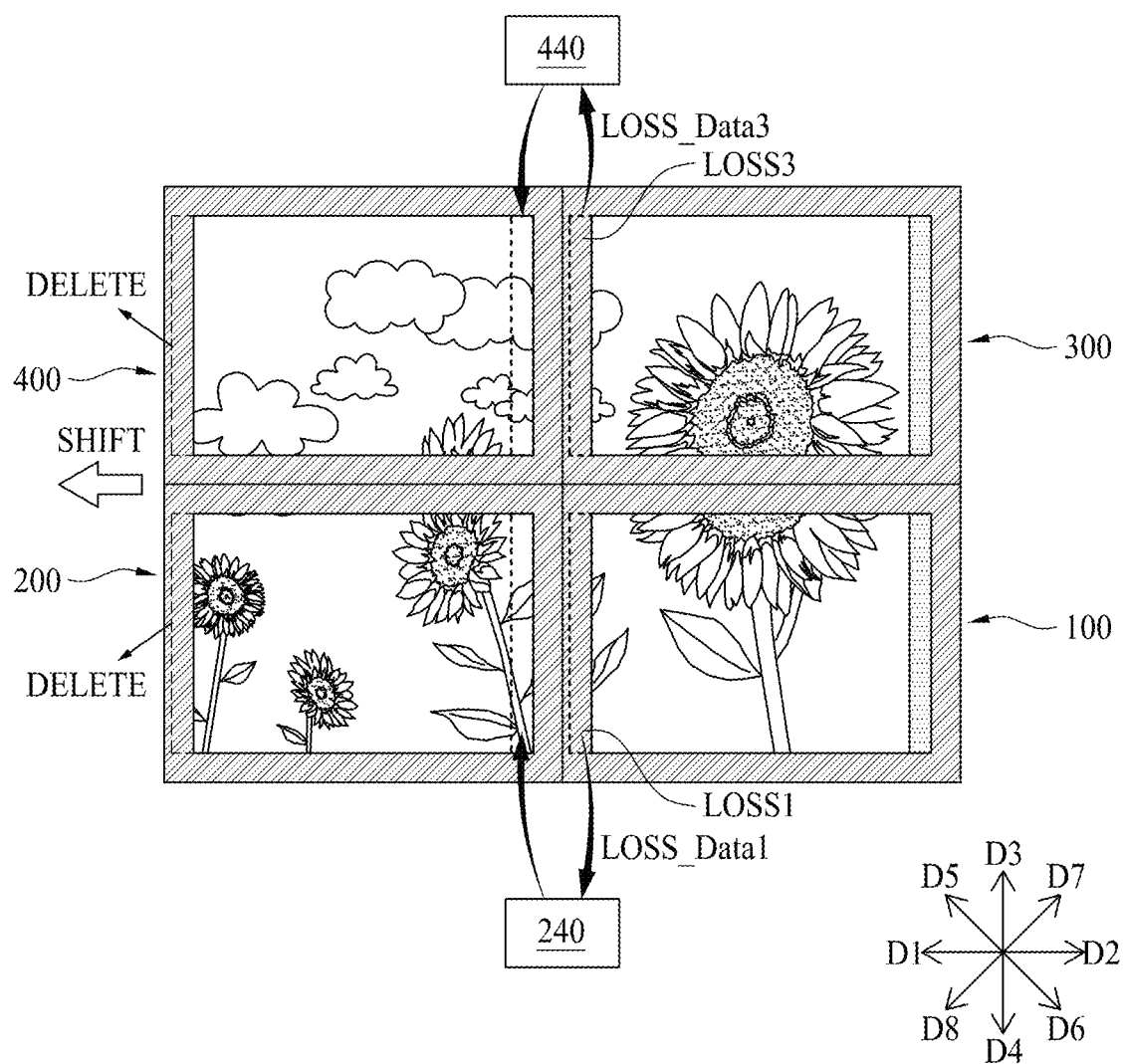
FIG. 6 is a view illustrating a method of shifting the multi-image shown in FIG. 5 in a first direction.

FIG. 5 is a view illustrating an example of a multi-image output through a multi-display according to the present disclosure, and FIG. 6 is a view illustrating a method of shifting the multi-image shown in FIG. 5 in a first direction. In particular, FIG. 5 shows a non-shifted multi-image, and FIG. 6 shows a multi-image after the multi-image shown in FIG. 5 is shifted in the first direction D1.

As described in the background of the invention, the light emitting display apparatus uses a method of compensating for deterioration of the light emitting device by varying a position at which the image is displayed.

The first to fourth light emitting display apparatuses 100, 200, 300, and 400 configuring the multi-display according to the present disclosure also uses the method of compensating for deterioration of the light emitting device by varying a position at which an image is displayed.

For example, when a first image IM1 output on the first light emitting display apparatus 100 is shifted in a first direction D1, the first controller 140 transmits information on the first direction D1 and pieces of first lossy image data LOSS_data1 configuring a first lossy image LOSS1 of the first image IM1 which is lost in the first light emitting display apparatus 100 to the second controller 240 of the second light emitting display apparatus 200 adjacent to the first light emitting display apparatus 100 in the first direction D1. In FIGS. 5 and 6, the first direction D1 may be a left direction.

The first image IM1 is an image output through the first display area 112 of the first light emitting display apparatus 100 shown in FIG. 5.

The first lossy image LOSS1 refers to an image which is not output in the first display area 112 of the first light emitting display apparatus 100 when the first image IM1 shown in FIG. 5 is shifted in the first direction (left direction) D1 as shown in FIG. 6.

For example, as the first image IM1 is shifted to the left, the image, of the first image IM1 shown in FIG. 5, which is output on the left side of the first display area 112, that is, the first lossy image LOSS1, is not visible any longer in the first display area 112.

Thus, the first controller 140 transmits the pieces of the first lossy image data LOSS_Data1 configuring the first lossy image LOSS1 to the second controller 240. In this case, the first lossy image data LOSS_Data1 may be transferred from the storage unit 145 of the first controller 140 to the storage unit of the second controller 240.

As illustrated in FIG. 6, in a case where the first image IM1 is shifted in the first direction (left direction) D1, the image is not output on a right portion of the first display area 112.

When the pieces of the first lossy image data LOSS_Data1, together with the information on the first direction D1, are received from the first controller 140, the second controller 240 shifts a second image IM2 output on the second light emitting display apparatus 200 in the first direction (left direction) D1 and outputs the first lossy image LOSS1 together with the second image using the pieces of the first lossy image data LOSS_Data1.

For example, when the second image IM2 is shifted to the left, an image is not output to the right portion of the second display area 212 of the second light emitting display apparatus 200.

However, since the first lossy image LOSS1, which was a part of the first image IM1, is output on the right portion of the second display area 212 together with the second image IM2, the image may be output on all the portions of the second display area 212.

In this case, a portion of the second image IM2 output on the left side of the second image IM2 is lost. That is, the image output on the left side of the second image IM2 is lost.

However, even if the multi-image is shifted in the first direction D1, the first lossy image LOSS1, which has configured the first image IM1, may be output through the second display area 212.

Therefore, according to the present disclosure, a size of the lost image may be reduced.

In a case where the multi-display includes the four light emitting display apparatuses 100, 200, 300, and 400 as shown in FIG. 5, the method executed in the first light emitting display apparatus 100 and the second light emitting display apparatus 200 may also be executed in the third light emitting display apparatus 300 and the fourth light emitting display apparatus 400 in the same manner.

That is, in a case where a third image IM3 output on the third light emitting display apparatus 300 is shifted in the first direction (left direction) D1, the third controller 340 may transmit the information on the first direction D1 and pieces of third lossy image data LOSS_Data3 configuring a third lossy image LOSS3 of the third image IM3 which is lost in the third light emitting display apparatus 300 to the fourth controller 440 of the fourth light emitting display apparatus 400 adjacent to the third light emitting display apparatus 300 the first direction D1.

When the pieces of the third lossy image data LOSS_Data3, together with the information on the first direction D1, are received from the third controller 340, the fourth controller 440 shifts a fourth image IM4 output on the fourth light emitting display apparatus 400 in the first direction (left direction) D1 and outputs the third lossy image LOSS3 together with the fourth image using the pieces of the third lossy image data LOSS_Data3.

In this case, the image output on the left side of the fourth image IM4 is lost.

However, even if the multi-image is shifted in the first direction D1, the third lossy image LOSS3, which has configured the third image IM3, may be output through the fourth display area 412 of the fourth light emitting display apparatus 400.

Thus, according to the present disclosure, a size of a lossy image may be reduced.

In this case, in a case where the multi-image is shifted in a direction opposite to the first direction (left direction) D1, a process opposite to that described above may be performed.

For example, in a case where the second image IM2 output on the second light emitting display apparatus 200 is shifted in the second direction D2 opposite to the first direction D1, that is, in the right direction of FIG. 5, the second controller 240 may transmit information on the second direction D2 and pieces of second lossy image data configuring the second lossy image of the second image IM2 which is lost in the second light emitting display apparatus 200 to the first controller 140.

In this case, the second lossy image data may be transmitted from the storage unit of the second controller 240 to the storage unit of the first controller 140.

When the pieces of the second lossy image data, together with the information on the second direction D2, are received from the second controller 240, the first controller 140 may shift the first image IM1 output on the first light emitting display apparatus 100 in the second direction D2 and output the second lossy image together with the first image IM1 in the second direction D2.

Further, in a case where the fourth image IM4 output on the fourth light emitting display apparatus 400 is shifted in the second direction D2 opposite to the first direction D1, that is, in the right direction of FIG. 5, the fourth controller 440 may transmit the information on the second direction D2 and pieces of fourth lossy image data configuring a fourth lossy image of the fourth image IM4 which is lost in the fourth light emitting display apparatus 400 to the third controller 340.

In this case, the fourth lossy image data may be transmitted from the storage unit of the fourth controller 440 to the storage unit of the third controller 340.

When the pieces of fourth lossy image data, together with the information on the second direction D2, are received from the fourth controller 440, the third controller 340 may shift the third image IM3 output on the third light emitting display apparatus 300 in the second direction D2 and output the fourth lossy image together with the third image IM3.

In the above, the method of operating the multi-display according to the present disclosure when the multi-image is shifted in the first direction D1 or the second direction D2 has been described.

However, even when the multi-image is shifted in the third direction D3 and the fourth direction D4 perpendicular to the first direction D1 and the second direction D2, the multi-display according to the present disclosure may be operated in a method similar to the method described above.

Figure 7:
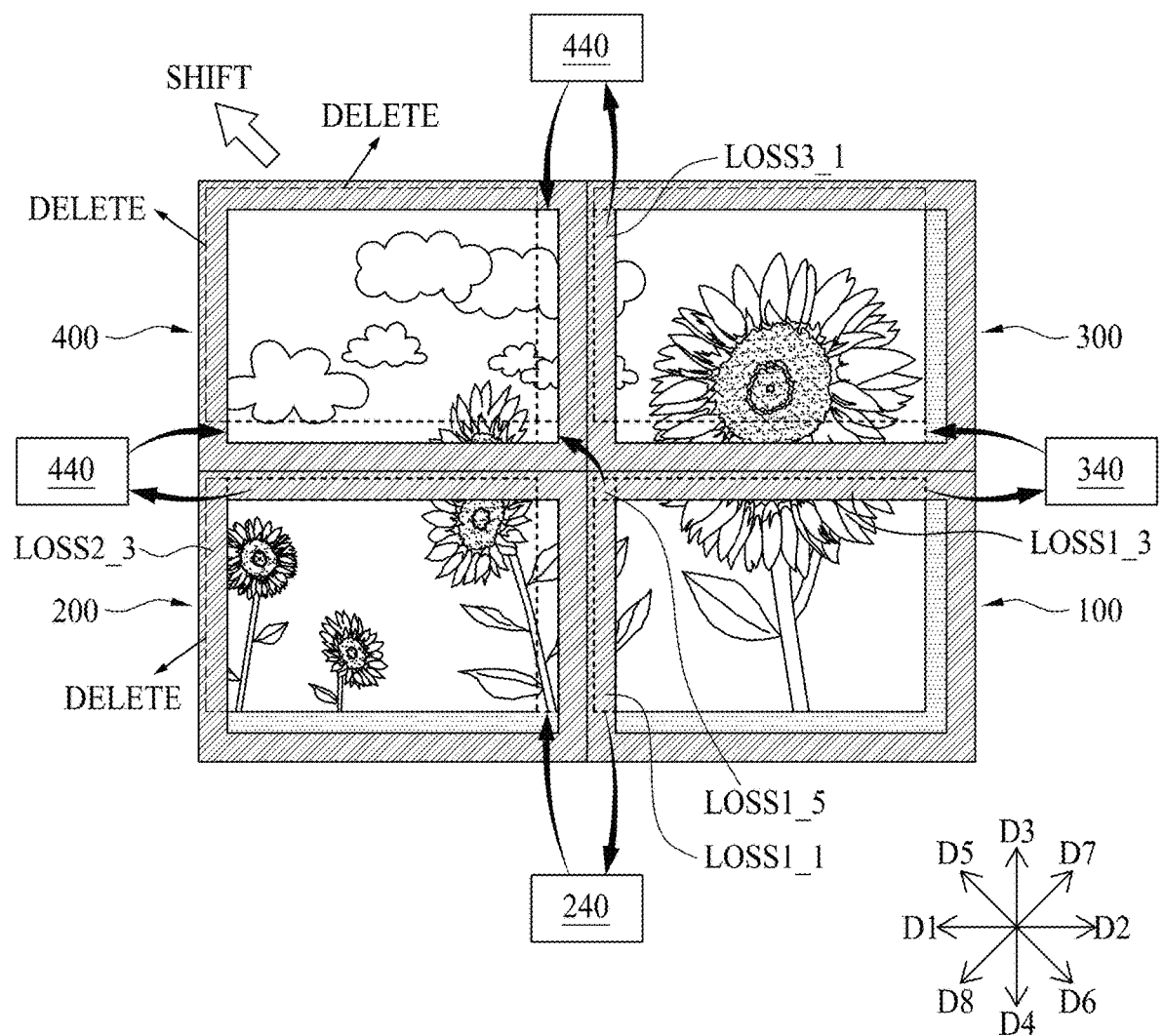
FIG. 7 is a view illustrating a method of shifting the multi-image shown in FIG. 5 in a fifth direction.

FIG. 7 is a view illustrating a method of shifting a multi-image shown in FIG. 5 in a fifth direction. In particular, FIG. 5 shows a non-shifted multi-image and FIG. 7 shows a multi-image after the image shown in FIG. 5 is shifted in the fifth direction D5.

For example, in a case where the first image IM1 output on the first light emitting display apparatus 100 is shifted in the fifth direction D5 which is a diagonal direction between the first direction D1 and the third direction D3 perpendicular to the first direction, the first controller 140 transmits information on the fifth direction D5 and pieces of 1_1th lossy image data configuring a 1_1th lossy image LOSS1_1 of the first image IM1 which is lost in the first direction D1 of the first light emitting display apparatus 100 to the second controller 240 of the second light emitting display apparatus 200 adjacent to the first light emitting display apparatus 100 in the first direction D1.

In addition, the first controller 140 transmits the information on the fifth direction D5 and pieces of 1_3th lossy image data configuring a 1_3th lossy image LOSS1_3 of the first image IM1 which is lost in the third direction D3 of the first light emitting display apparatus 100 to the third controller 340 of the third light emitting display apparatus 300 adjacent to the first light emitting display apparatus 100 in the third direction D3.

In addition, the first controller 140 transmits the information on the fifth direction D5 and pieces of 1_5th lossy image data configuring a 1_5th lossy image LOSS1_5 of the first image IM1 which is lost in the fifth direction D5 of the first light emitting display apparatus 100 to the fourth controller 440 of the fourth light emitting display apparatus 400 adjacent to the first light emitting display apparatus 100 in the fifth direction D5.

For example, as the first image IM1 illustrated in FIG. 5 is shifted in the fifth direction D5, the image of the first image IM1 which is output on the left side of the first display area 112, that is, the 1_1th lossy image LOSS 1_1, is not visible any longer in the first display area 112 as shown in FIG. 7. Thus, the first controller 140 transmits pieces of the 1_1th lossy image data configuring the 1_1th lossy image LOSS1_1 to the second controller 240. In this case, the pieces of the 1_1th lossy image data may be transmitted from the storage unit 145 of the first controller 140 to the storage unit of the second controller 240.

Further, as the first image IM1 illustrated in FIG. 5 is shifted in the fifth direction D5, the image of the first image IM1 which is output on the upper end of the first display area 112, that is, the 1_3th lossy image LOSS 1_3, is not visible any longer in the first display area 112 as shown in FIG. 7. Thus, the first controller 140 transmits pieces of the 1_3th lossy image data configuring the 1_3th lossy image LOSS1_3 to the third controller 340. In this case, the pieces of the 1_3th lossy image data may be transmitted from the storage unit 145 of the first controller 140 to the storage unit of the third controller 340.

Further, as the first image IM1 illustrated in FIG. 5 is shifted in the fifth direction D5, the image of the first image IM1 which is output on an area where the upper end and the left side of the first display area 112 meet, that is, the 1_5th lossy image LOSS 1_5, is not visible any longer in the first display area 112 as shown in FIG. 7. Thus, the first controller 140 transmits pieces of the 1_5th lossy image data configuring the 1_5th lossy image LOSS1_5 to the fourth controller 440. In this case, the pieces of the 1_5th lossy image data may be transmitted from the storage unit 145 of the first controller 140 to the storage unit of the fourth controller 440.

When the first image IM1 is shifted in the fifth direction D5 as shown in FIG. 7, the image is not output in the right and bottom portions of the first display area 112.

When the pieces of the 1_1th lossy image data, together with the information on the fifth direction D5, are received from the first controller 140, the second controller 240 shifts the second image IM2 output on the second light emitting display apparatus 200 in the fifth direction D5 and outputs the 1_1th lossy image LOSS1_1 together with the second image.

When the pieces of the 1_3th lossy image data, together with the information on the fifth direction D5, are received from the first controller 140, the third controller 340 shifts the third image IM3 output on the third light emitting display apparatus 300 in the fifth direction D5 and outputs the 1_3th lossy image LOSS1_3 together with the third image.

When the pieces of the 1_5th lossy image data, together with the information on the fifth direction D5, are received from the first controller 140, the fourth controller 440 shifts the fourth image IM4 output on the fourth light emitting display apparatus 400 in the fifth direction D5 and outputs the 1_5th lossy image LOSS1_5 together with the fourth image.

In this case, the process performed in the first light emitting display apparatus 100 may further be performed in the second light emitting display apparatus 200.

That is, when the second image IM2 output on the second light emitting display apparatus 200 is shifted in the fifth direction D5, the second controller 240 transmits the information on the fifth direction D5 and pieces of 2_3th lossy image data configuring 2_3th lossy image LOSS2_3 of the second image IM2 which is lost in the third direction D3 of the second light emitting display apparatus 200 to the fourth controller 440 of the fourth light emitting display apparatus 400 adjacent to the second light emitting display apparatus 200 in the third direction D3.

When the pieces of the 2_3th lossy image data, together with the information on the fifth direction D5, are received from the second controller 240, the fourth controller 440 outputs the 2_3th lossy image LOSS2_3 together with the fourth image output on the fourth light emitting display apparatus 400.

The process performed in the first light emitting display apparatus 100 and the second light emitting display apparatus 200 may be further performed also in the third light emitting display apparatus 300 and the fourth light emitting display apparatus 400.

That is, when the third image IM3 output on the third light emitting display apparatus 300 is shifted in the fifth direction D5, the third controller 340 transmits the information on the fifth direction D5 and pieces of 3_1th lossy image data configuring 3_1th lossy image LOSS3_1 of the third image IM3 which is lost in the first direction D1 of the third light emitting display apparatus 300 to the fourth controller 440 of the fourth light emitting display apparatus 400 adjacent to the third light emitting display apparatus 300 in the first direction D1.

When the pieces of the 3_1th lossy image data, together with the information on the fifth direction D5, are received from the third controller 340, the fourth controller 440 outputs the 3_1th lossy image LOSS3_1 together with the fourth image output on the fourth light emitting display apparatus 400.

That is, the fourth controller 440 outputs the remaining image after the fourth image IM4 is shifted in the fifth direction D5, the 2_3th lossy image LOSS2_3, the 3_1th lossy image LOSS3_1, and the 1_5th lossy image LOSS1_5.

Thus, the image is output at all the portions of the fourth display area 412.

However, as illustrated in FIG. 7, the image is not output at the right and lower end portions of the first display area 112, at the right portion of the third display area 312, and at the lower end portion of the second display area 212.

In this case, the image output on the left side of the second image IM2, the image output on the upper end of the third image IM3, and the image output on the left side and the upper end of the fourth image IM4 are lost.

However, even if the multi-image is shifted in the fifth direction D5, the 1_1th lossy image LOSS1_1, the 1_3th lossy image LOSS1_3, the 1_5th lossy image LOSS1_5, the 3_1th lossy image LOSS3_1, and the 2_3 lossy image LOSS2_3 configuring the first image IM1 may be continuously output through the multi-display.

Therefore, according to the present disclosure, the size of a lossy image may be reduced.

In the above, the method of operating the multi-display according to the present disclosure when the multi-image is shifted in the fifth direction D5 has been described.

However, the multi-display according to the present disclosure may be operated according to a method similar to the method described above even when the multi-image is shifted in a sixth direction D6 opposite to the fifth direction D5 and in a seventh direction D7 and an eighth direction D8 perpendicular to the fifth direction D5.

Figure 8:
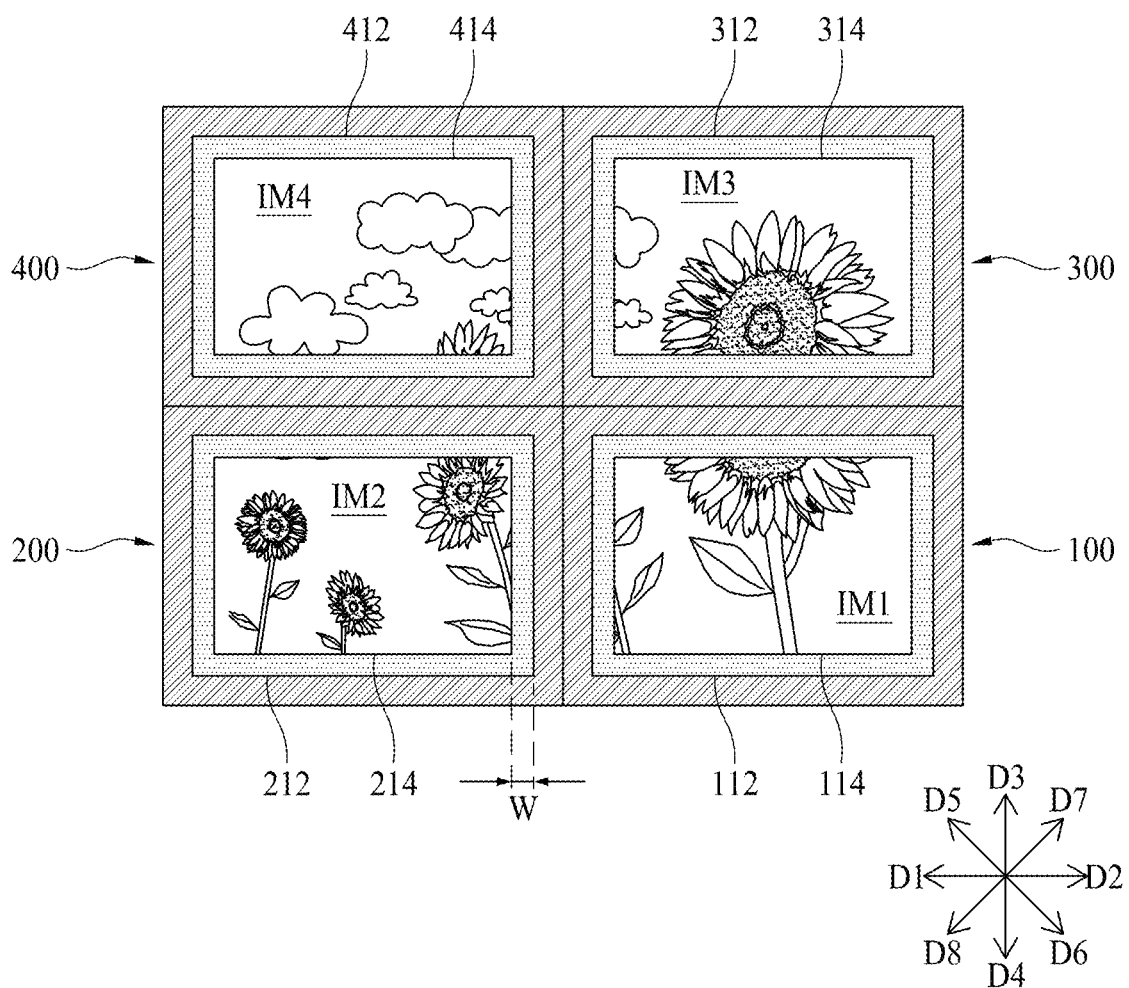
FIG. 8 is a view illustrating another example of a multi-image output through a multi-display according to the present disclosure.
Figure 9:
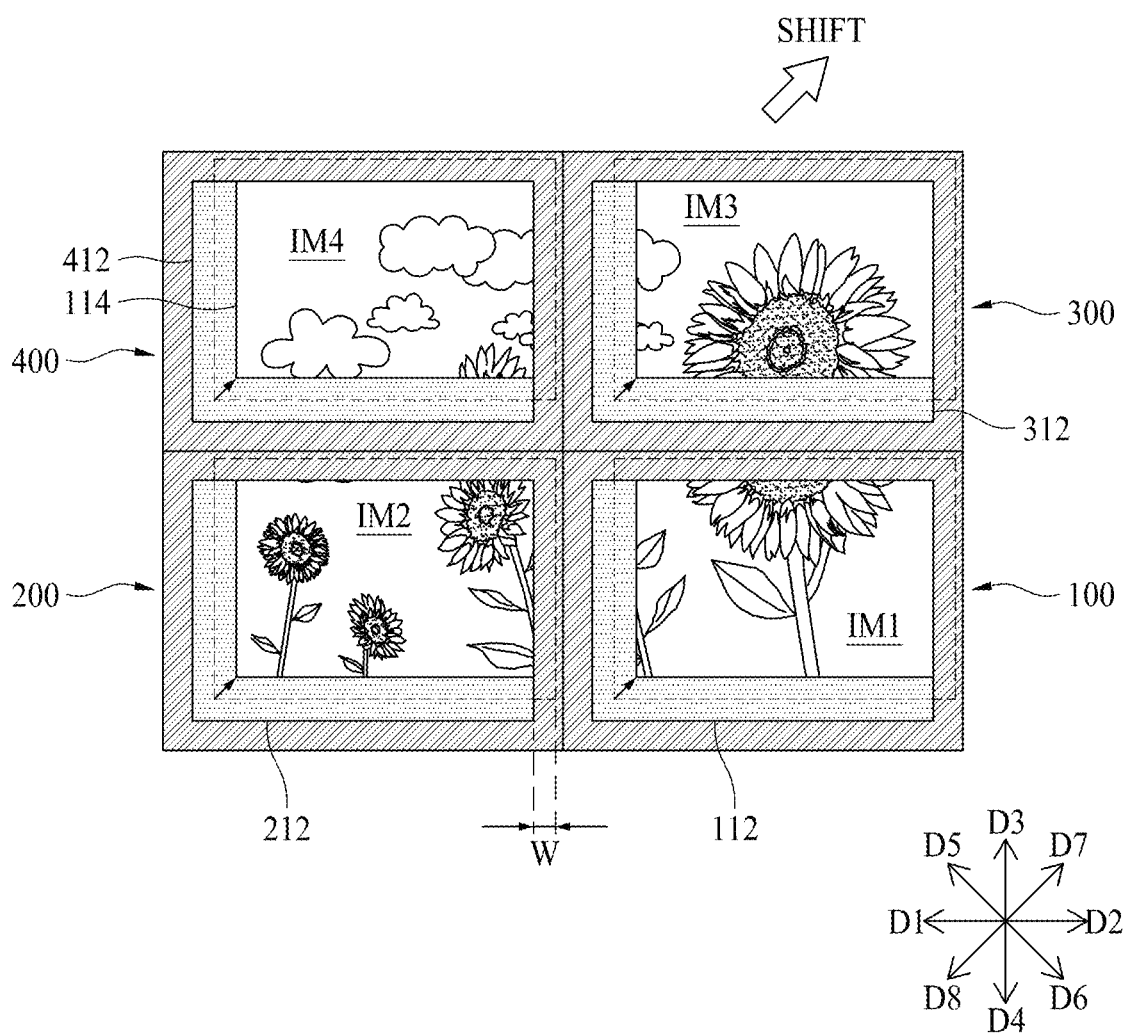
FIG. 9 is a view illustrating a method of shifting the multi-image shown in FIG. 8 in a seventh direction.

FIG. 8 is a view illustrating another example of a multi-image output through a multi-display according to the present disclosure, and FIG. 9 is a view illustrating a method of moving the multi-image shown in FIG. 8 in a seventh direction. In particular, FIG. 8 shows a non-shifted multi-image and FIG. 9 shows a multi-image after the multi-image shown in FIG. 8 is shifted in the seventh direction D7.

As described above, the first controller 140, which controls the function of the first light emitting display apparatus 100 among the light emitting display apparatuses, shares information LI varying a position of an image with the controllers controlling functions of the other light emitting display apparatuses.

That is, the first controller 140, the second controller 240, the third controller 340, and the fourth controller 440 share the information LI.

In this case, in the multi-display shown in FIGS. 8 and 9, the first controller 140 may transmit information indicating that a size 114 of the first image IM1 output on the first light emitting display apparatus 100 is reduced to a size smaller than the size of the first display area 112 of the first light emitting display panel 110 applied to the first light emitting display apparatus to the controllers 240, 340, and 440 controlling the functions of the other light emitting display apparatuses.

The second to fourth controllers 240, 340, and 440 may also transmit information indicating that sizes 214, 314, and 414 of the second to fourth images IM2, IM3, and IM4 output on the second to fourth light emitting display apparatuses 200, 300, and 400 are reduced to a size smaller than the sizes of the second to fourth display areas 212, 312, and 412 of the second to fourth light emitting display panels 210, 310, and 410, respectively, to the first controller 140 and therebetween.

In this case, the sizes 114, 214, 314, and 414 of the reduced first to fourth images IM1 to IM4 may be set by the first to fourth controllers 140, 240, 340, and 440 in consideration of the shifted distances of the first to fourth images IM1 to IM4.

That is, even though the first to fourth images IM1 to IM4 shown in FIG. 8 are shifted in the seventh direction D7 as shown in FIG. 9, if the width W between the first to fourth display areas 112, 212, 312, and 412 and the reduced images are set to be equal to or greater than the shifted distances of the first to fourth images IM1 to IM4, there is no lossy portion in the images and a portion of the images is not shifted to adjacent light emitting display apparatuses.

Therefore, the first to fourth controllers 140, 240, 340, and 440 which share the information that the width W between the first to fourth display areas 112, 212, 312, 412 and the reduced images is equal to or greater than the shifted distances of the first to fourth images IM1 to IM4 may realign the pieces of the first to fourth multi-image data to generate pieces of the first to fourth image data corresponding to the sizes 114, 214, 314, and 414.

The pieces of the first to fourth image data are converted into data voltages in the first to fourth data drivers provided in the first to fourth light emitting display apparatuses 100, 200, 300, and 400, respectively.

As shown in FIG. 8, when the data voltages are output to the first to fourth light emitting display panels, the first to fourth images IM1 to IM4 having sizes 114, 214, 314 and 414 smaller than the sizes of the first to fourth display areas 112, 212, 312, and 412 are output.

Figure 10:
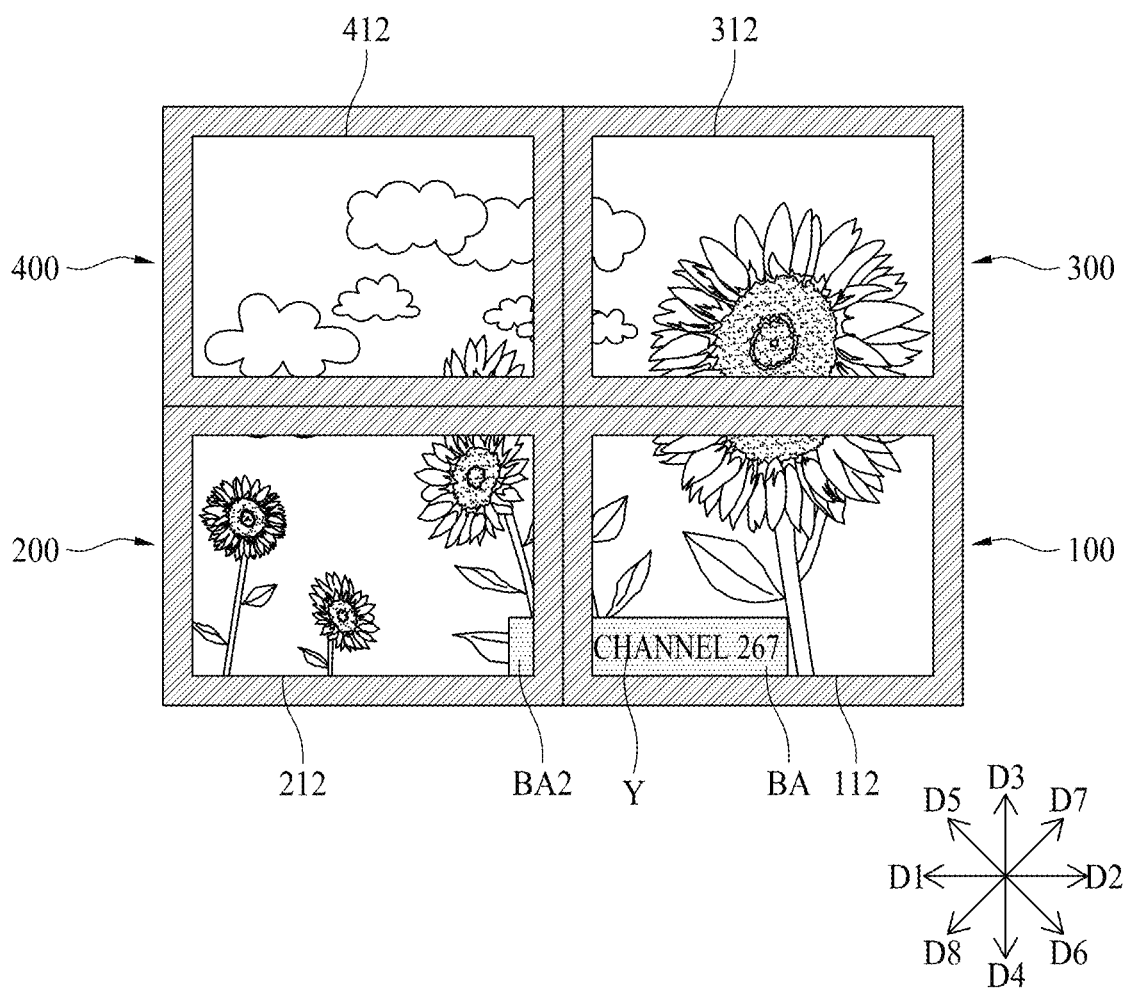
FIG. 10 is a view illustrating another example of a multi-image output through a multi-display according to the present disclosure.

FIG. 10 is a view illustrating another example of a multi-image output through a multi-display according to the present disclosure.

As described above with reference to FIGS. 6 to 9, in a case where the first image IM1 output on the first light emitting display apparatus 100 is shifted in any one of the first to eighth directions D1 to D8, if an area BA which is brighter or darker than the pieces of the first multi-image data 1M_Data transmitted from the distributing device 600 to the first controller 140 is included in the first lossy image, the first controller 140 may output information on the brightened or darkened area BA and information on brightness of the brightened or darkened area BA to any one of the second to fourth controllers 240, 340, and 440.

For example, as shown in FIG. 10, if a still image Y (e.g., channel information, broadcasting station information, advertisement information, etc.) which is continuously output for a long period of time is detected, each of the first to fourth light emitting display apparatuses 100, 200, 300, and 400 may darken the periphery of the still image Y to reduce a degree of deterioration of the light emitting devices on the periphery of the still image Y. Since this method is currently performed through various algorithms, a detailed description thereof will be omitted.

In this case, the area indicated by the darkened area BA in the first display area 112 may be shifted to the second display area 212 of the second light emitting display apparatus 200 as shown in FIG. 10, for example, through the shifting as described above with reference to FIGS. 6 and 7.

In this case, since pieces of the image data corresponding to the still image Y is not transmitted to the second light emitting display apparatus 200, in a general case, the second light emitting display apparatus 200 cannot know that the darkened area BA2 included in the first lossy image is the peripheral area of the still image Y.

In contrast, in the present disclosure, as described above, the first controller 140 may transmit the information on the darkened area BA2 and the information on the brightness of the darkened area BA2 to at least any one of the second to fourth controllers 240, 340, and 440.

Therefore, even though the still image Y is not output on the second display area 212, the second controller 240 may express the peripheral area of the still image Y in the second display area 212, as the darkened area BA2, as shown in FIG. 10 using the information on the darkened area BA2 and the information on the brightness of the darkened area BA2 transmitted from the first controller 140.

Accordingly, brightness of the darkened area BA on the periphery of the still image Y in the first display area 112 may be similar to brightness of the darkened area BA2 of the second display area 212. Therefore, a problem that luminance is significantly different between the first light emitting display apparatus 100 and the second light emitting display apparatus 200 may be prevented.

That is, according to the present disclosure as described above, even if such shifting as described above occurs in the multi-display, the problem that luminance is significantly different between the adjacent light emitting display apparatuses may be prevented.

In addition, according to the present disclosure as described above, even if the multi-image is shifted in various directions in order to prevent deterioration of the light emitting display apparatuses in the multi-display, a lossy image may be minimized or reduced.

According to the present disclosure, even if a position at which an image is individually output in each of the light emitting display apparatuses configuring the multi-display is varied, loss of a multi-image output on the multi-display may be minimized or reduced. Therefore, quality of the multi-image output on the multi-display may be improved.

Also, since the position at which an image is output on each of the light emitting display apparatuses is varied, a speed at which the light emitting devices configuring the light emitting display apparatuses are degraded may be reduced, and accordingly, quality of the multi-image output on the multi-display may be improved.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations may be made in the multi-display of the present disclosure without departing from the spirit or scope of the disclosure. Thus, it is intended that the present disclosure covers the modifications and variations of this disclosure provided they come within the scope of the appended claims and their equivalents.

What is claimed is:

1. A multi-display, comprising:
at least two light emitting display apparatuses; and
a distributing device distributing pieces of multi-image data transmitted from an external system to the light emitting display apparatuses,
wherein a first controller controlling a function of a first light emitting display apparatus among the light emitting display apparatuses shares information for varying a position of an image with controllers controlling functions of the other light emitting display apparatuses, wherein
when a first image output on the first light emitting display apparatus is shifted in a first direction, the first controller transmits information on the first direction and pieces of first lossy image data configuring a first lossy image of the first image which is lost in the first light emitting display apparatus to a second controller of a second light emitting display apparatus adjacent to the first light emitting display apparatus in the first direction, and
the second controller shifts a second image output on the second light emitting display apparatus in the first direction and outputs the first lossy image together with the second image.

2. The multi-display of claim 1, wherein
when the second image output on the second light emitting display apparatus is shifted in a second direction opposite to the first direction, the second controller transmits information on the second direction and pieces of second lossy image data configuring a second lossy image of the second image which is lost in the second light emitting display apparatus to the first controller, and
the first controller shifts the first image output on the first light emitting display apparatus in the second direction and outputs the second lossy image together with the first image.

3. A multi-display, comprising:
at least two light emitting display apparatuses; and
a distributing device distributing pieces of multi-image data transmitted from an external system to the light emitting display apparatuses,
wherein a first controller controlling a function of a first light emitting display apparatus among the light emitting display apparatuses shares information for varying a position of an image with controllers controlling functions of the other light emitting display apparatuses, wherein
when a first image output on the first light emitting display apparatus is shifted in a fifth direction which is a diagonal direction between the first direction and a third direction perpendicular to the first direction, the first controller transmits information on the fifth direction and pieces of 1_1th lossy image data configuring a 1_1th lossy image of the first image which is lost in the first direction of the first light emitting display apparatus to a second controller of a second light emitting display apparatus adjacent to the first light emitting display apparatus in the first direction,
transmits the information on the fifth direction and pieces of 1_3th lossy image data configuring a 1_3th lossy image of the first image which is lost in the third direction of the first light emitting display apparatus to a third controller of a third light emitting display apparatus adjacent to the first light emitting display apparatus in the third direction, and
transmits the information on the fifth direction and pieces of 1_5th lossy image data configuring a 1_5th lossy image of the first image which is lost in the fifth direction of the first light emitting display apparatus to a fourth controller of a fourth light emitting display apparatus adjacent to the first light emitting display apparatus in the fifth direction.

4. The multi-display of claim 3, wherein
the second controller shifts a second image output from the second light emitting display apparatus in the fifth direction and outputs the 1_1th lossy image together with the second image,
the third controller shifts a third image output from the third light emitting display apparatus in the fifth direction and outputs the 1_3th lossy image together with the third image, and the fourth controller shifts a fourth image output from the fourth light emitting display apparatus in the fifth direction and outputs the 1_5th lossy image together with the fourth image.

5. A multi-display, comprising:

at least two light emitting display apparatuses; and a distributing device distributing pieces of multi-image data transmitted from an external system to the light emitting display apparatuses, wherein a first controller controlling a function of a first light emitting display apparatus among the light emitting display apparatuses shares information for varying a position of an image with controllers controlling functions of the other light emitting display apparatuses, wherein the first controller transmits information indicating that a size of a first image output on the first light emitting display apparatus is reduced to a size smaller than a size of a first display area of a first light emitting display panel applied to the first light emitting display apparatus to the controllers controlling the functions of the other light emitting display apparatuses.

6. The multi-display of claim 5, wherein a width between the first display area and the reduced first image is set to be greater than a shifted distance of the first image.

7. The multi-display of claim 1, wherein when the first image output on the first light emitting display apparatus is shifted in the first direction, if an area brighter or darker than first multi-image data transmitted from the distributing device to the first controller is included in the first lossy image, the first controller outputs information on the brightened or darkened area and information on brightness of the brightened or darkened area to the second controller.

* * * * *